United States Patent [19]

Morrison et al.

[11] 4,056,786
[45] Nov. 1, 1977

[54] SINGLE ENDED CLASS D AMPLIFIER

[75] Inventors: Heber J. Morrison, Ellicott City; Rockney W. Howland, Glen Burnie, both of Md.

[73] Assignee: Westinghouse Electric Corporation, Pittsburgh, Pa.

[21] Appl. No.: 714,923

[22] Filed: Aug. 16, 1976

Related U.S. Application Data

[63] Continuation of Ser. No. 502,316, Sept. 3, 1974, abandoned.

[51] Int. Cl.$^2$ ............................................. H03F 3/04
[52] U.S. Cl. .............................. 330/207 A; 330/251; 330/297
[58] Field of Search ................. 330/10, 207 A, 22, 40, 330/202

[56] References Cited

U.S. PATENT DOCUMENTS

| | | | |
|---|---|---|---|
| 2,969,506 | 1/1961 | Vackar | 330/207 A |
| 3,009,112 | 11/1961 | Vackar et al. | 330/207 A |

*Primary Examiner*—James B. Mullins
*Attorney, Agent, or Firm*—J. B. Hinson

[57] ABSTRACT

A low level class D amplifier is disclosed. High efficiency is assured by operating the active devices in the switching or class D mode and recovering substantial portions of the power contained in the harmonics generated. The amplifier includes a switching circuit or class D active circuit, a harmonic impedance circuit and an RF circuit serially connected across a power supply for supplying DC power to the amplifier. During the conducting state of the class D active circuit, the harmonic impedance circuit limits the harmonic currents and stores energy as a magnetic field. Substantially all of the stored energy is recovered during the non-conducting portion of the active circuit and returned to the DC power supply. Limiting harmonic currents reduces the dissipation of the active devices. Recovering the stored energy substantially improves the efficiency of the amplifier.

3 Claims, 4 Drawing Figures

SINGLE ENDED CLASS D AMPLIFIER

This is a continuation of application Ser. No. 502,316 filed Sept. 3, 1974, now abandoned.

BACKGROUND OF THE INVENTION

1. Field of the Invention:

The invention relates to amplifiers and more particularly to class D amplifiers utilizing circuits to limit the amplitude of harmonic currents flowing the active devices utilized in the amplifier.

2. Description of the Prior Art:

Prior art class D amplifiers have generally been limited to complementary or bridge type circuits due to the difficulty encountered with harmonics which are generated when the active devices switch on and off. Single ended circuits have not been practical because the prior art circuit provided no method for limiting the harmonic currents and power when the active device abruptly switches between the conducting and non-conducting states.

SUMMARY OF THE INVENTION

The above problems with prior art class D amplifiers are substantially overcome by a circuit which is the subject of this invention. High efficiency class D operation is provided by an amplifier comprising a switching circuit serially coupled with a harmonic impedance circuit and an RF circuit. Power is supplied to the amplifier by a DC power supply coupled across the series combination of the switching circuit, the harmonic impedance and the RF circuit. The harmonic impedance permits class D operation without generating high harmonic currents in the switching circuit. Reducing the harmonic currents generates an essentially square wave voltage across the switching circuit and a sine wave, having the same fundamental frequency as the pulse utilized to drive the class D amplifier, across the RF circuit. High efficiency is achieved by storing harmonic energy in the harmonic impedance circuit when the switching circuit is in the conducting state and recovering this energy when the switching circuit is in the non-conducting state. Duty cycle modulating the pulse utilized to drive the amplifier results in an amplitude modulated RF signal at the output of the amplifier.

DETAILED DESCRIPTION

Figure 1:
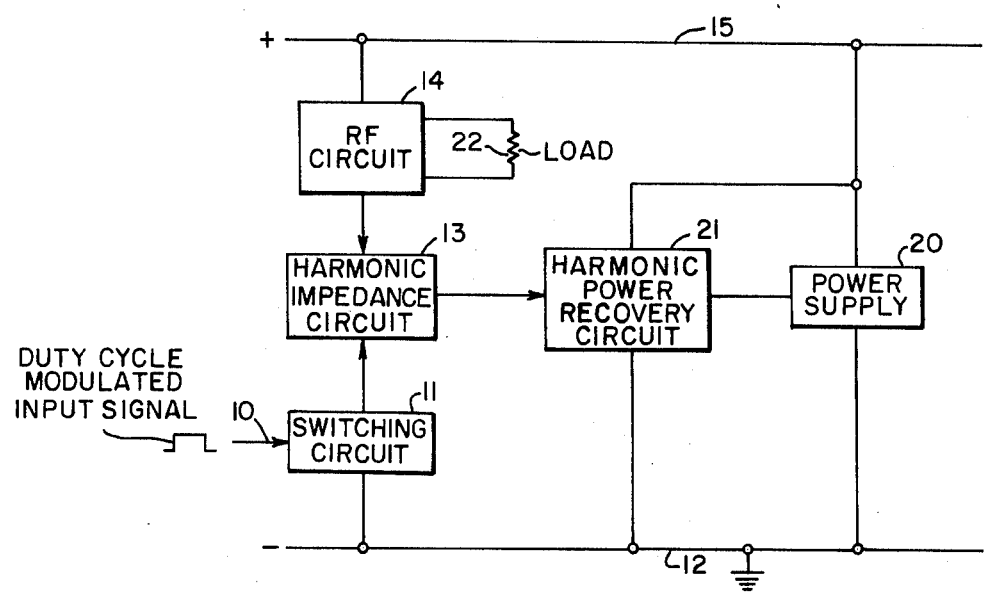
FIG. 1 is a generalized block diagram of the amplifier.

FIG. 1 is a block diagram of the class D amplifier. The preferred embodiment illustrated in FIG. 1 will be described utilizing a duty cycle modulated pulse as a driving source. Duty cycle modulating the driving pulse results in an amplitude modulated signal at the output of the amplifier.

A duty cycle modulated pulse is coupled to the input terminal 10 of switching circuit 11. For the high level of the input signal the switching circuit 11 is in a low impedance state while for the low level of this signal the switching circuit 11 is in the high impedance state. Ideally the impedance of the switching circuit 11 would be zero in the low impedance state and infinity in the high impedance state. These impedance values are not normally realized to practical circuits however impedance levels sufficient to cause the circuit to operate at a high efficiency level are achievable with commercially available components such as switching transistors. Although the detailed circuit to be subsequently discussed uses a single transistor for the switching circuit, it is obvious that a plurality of parallel connected transistors may be used if higher power levels are desired.

The switching circuit 11 is series coupled with a harmonic impedance circuit 13 and an RF circuit 14. This series combination is coupled to the positive and negative power busses 15 and 12. Power is supplied to the RF portions of the amplifier by a power supply 20 which is coupled to the positive and negative power busses 15 and 12. The harmonic power recovery circuit 21 is coupled to the harmonic impedance circuit 13 and the positive and negative power busses, 15 and 12, such that substantial portions of the harmonic power resulting from harmonic currents flowing in the switching circuit 11 is returned to the power supply 20. Recovery of harmonic power substantially improves the efficiency of the amplifier.

As the switching circuit 11 alternately changes impedance state in response to the duty cycle modulated input signal, a voltage having alternate high and low levels is superimposed across the series combination of the harmonic impedance circuit 13 and the RF circuit 14. This waveform is rich in harmonics of the duty cycle modulated input signal. Harmonic impedance circuit 13 is designed to limit the harmonic currents and to store energy contained in these harmonics during the time that switching circuit 11 is in its low impedance state. Energy at the fundamental frequency of the duty cycle modulated input signal is coupled to the RF load 22 by the RF circuit 14. Energy stored in the harmonic impedance circuit 13 is recovered by the harmonic power recovery circuit 21 and returned to the power supply 20, when the switching circuit 11 is in the high impedance state. Recovery of harmonic energy greatly improves the overall efficiency of the amplifier.

Figure 2:
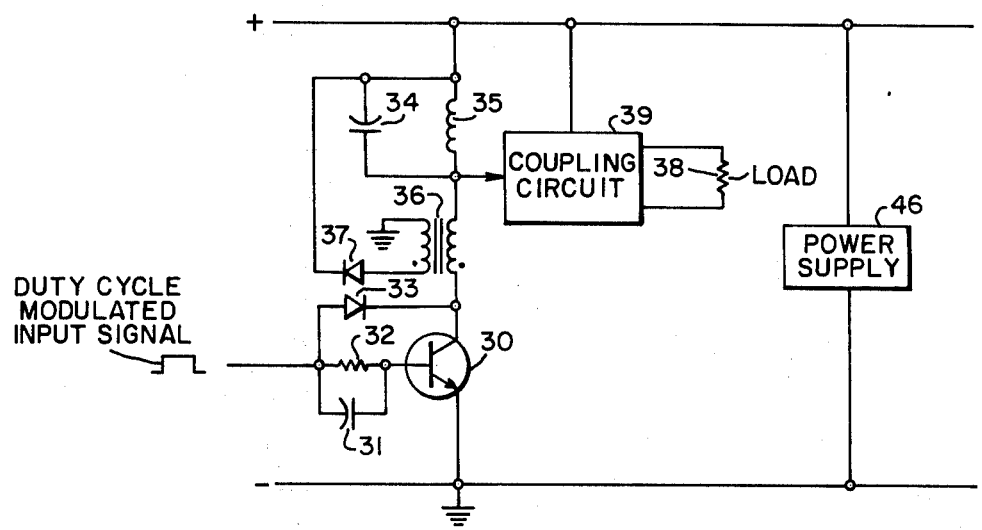
FIG. 2 is a schematic diagram of the amplifier.

FIG. 2 is a more detailed schematic diagram of the preferred embodiment of the amplifier illustrated in FIG. 1. The on-off switching function is performed by a single transistor 30. Drive and bias to the transistor 30 is provided by a duty cycle modulated input signal coupled to the base of transistor 30 through a network comprising the parallel combination of a capacitor 31 and a resistor 32. The drive or base current of the transistor 30 is limited by a drive bypass diode 33. This diode coupled between the input to the amplifier and the collector of transistor 30 begins to limit the drive when the input signal is more positive than the collector of transistor 30.

The collector of transistor 30 is series coupled with a parallel tuned RF circuit, comprising a capacitor 34 and an inductor 35, and the primary winding of a recovery transformer 36. One terminal of the secondary winding of the recovery transformer 36 is connected to the ground terminal of the amplifier. The second terminal of the secondary of this transformer is coupled to the positive terminal of the power supply 46 through a diode 37. The combination of the recovery transformer 36 and the diode 37 comprises the harmonic impedance circuit 13 and the harmonic power recovery circuit 21 illustrated in FIG. 1.

An RF signal having a frequency corresponding to the fundamental frequency of the duty cycle modulated input signal is produced across a parallel tuned circuit comprising an inductor 35 and a capacitor 34. This RF signal is the useful output of the amplifier and in the most general case will be coupled to a load 38 through a coupling circuit 39. The details of the load 38 and the coupling circuit 39 will depend on the application. Designing the coupling circuit 39 to match the load 38 to the amplifier is a routine RF matching problem encountered by engineers any time a new RF amplifier is designed. Methods and circuits for solving this problem are well known in the art and therefore will not be discussed in detail here.

Figure 3:
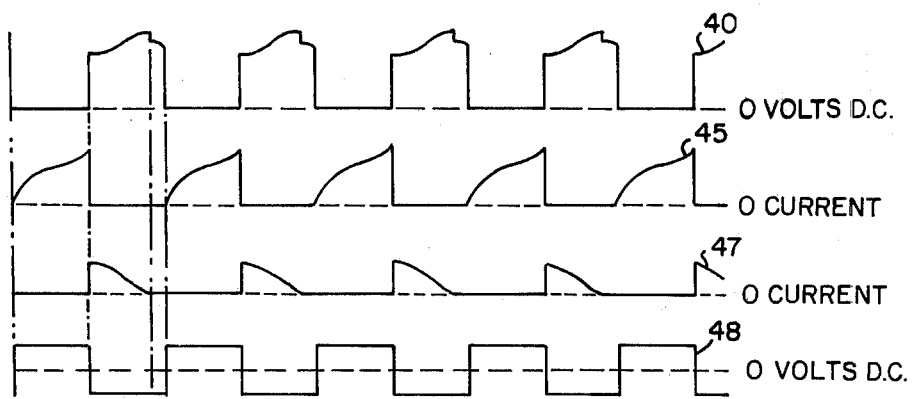
FIG. 3 is a typical waveform at various points of the amplifier illustrated in FIG. 2.

FIG. 3 illustrates waveforms generated during normal operation of a circuit illustrated in FIG. 2. The duty cycle modulated input signal, illustrated at reference numeral 48, is coupled to transistor 30 through a network comprising resistor 32 and capacitor 31. The positive and negative values of this signal are selected to assure that the transistor 30 operates as an on-off switch during all expected load conditions. It may be desirable to provide some means, such as a fuse, for protecting transistor 30 in case it is overloaded or the drive signal fails.

Coupling the duty cycle modulated input signal 48 to the base of transistor 30 causes this transistor to alternately switch on and off and generate the voltage waveform illustrated at numeral 40 at the collector of transistor 30. The departure of the positive portion of this waveform from the ideal square wave is due to the reactive impedance components of the RF circuits and the harmonic recovery and transformer 36. Although the negative portion of this waveform is shown as zero volts DC it will be readily appreciated that this is the ideal situation and may not be realized due to the voltage drop across the switching transistor 30.

When the duty cycle modulated input signal 48 changes from its negative to positive values, transistor 30 will switch to its highly conductive state. This causes the voltage at the collector of the transistor 30 to change abruptly from its high value to the low value thereby generating a voltage waveform at the collector of the transistor 30 which is rich in the harmonics of the fundamental frequency of the input signal. The polarities of the harmonic transformer 36 are selected such that the voltage induced in the secondary of this transformer reverse bias at diode 37 when the switching transistor 30 is conducting thereby causing the primary to appear as an inductance in series with the transistor 30 and the tuned RF circuit. This limits the instantaneous current flowing in the collector circuit of transistor 30 to a very low value. Limiting the instantaneous current in transistor 30 to a low value reduces the power at harmonic frequencies without substantially reducing the power at the fundamental frequency of the duty cycle modulated input signal. As the current begins to increase in the primary of the recovery transformer 36 energy is stored in the form of a magnetic field. The current and the amount of energy stored slowly increases until the point is reached where the input signal changes from its positive to its negative values. At this point the current in the collector of transistor 30 abruptly changes to zero. The waveform of the current in the collector of transistor 30 is illustrated at reference numeral 45.

As the current in the collector of transistor 30 decreases to zero the magnetic field begins to collapse causing the polarity of the voltage induced in the secondary of this transformer to reverse. Reversing the polarity of the voltage induced in the secondary of transformer 36 forward biases diode 37 causing the energy associated with the collapsing magnetic field to be transferred to the power supply 46. This significantly increases the efficiency of the amplifier as compared to prior art circuits because in prior art circuits the energy associated with the harmonics is simply dissipated in filler circuits of one type or another.

The current through diode 37 during the periods when the energy stored as a magnetic field in transformer 36 is being recovered are illustrated at reference numeral 47 of FIG. 3. Ideally the duration of each of the pulses illustrated in this waveform would be exactly equal to the pulse width of the duty cycle modulated input signal when the duty cycle is 50%. A 50% duty cycle results in 100% power output with the power output decreasing as the duty cycle decreases due to modulation. Using these rules 100% negative modulation would represent a zero duty cycle and 100% positive modulation would represent a 50% duty cycle.

The waveforms illustrated in FIG. 3 were generated by operating the circuit at frequency of 250 KHz. Transformer 36 had a 3 to 1 turns ratio resulting in a primary inductance of 5.1 microhenries, a secondary inductance of 44.8 microhenries and a leakage inductance of 0.31 microhenries. Values for the inductance 35 and capacitor 34 were selected to produce parallel resonance at the fundamental frequency of the input signal. Under these conditions the amplifier operated at an efficiency of approximately 90%.

Figure 4:
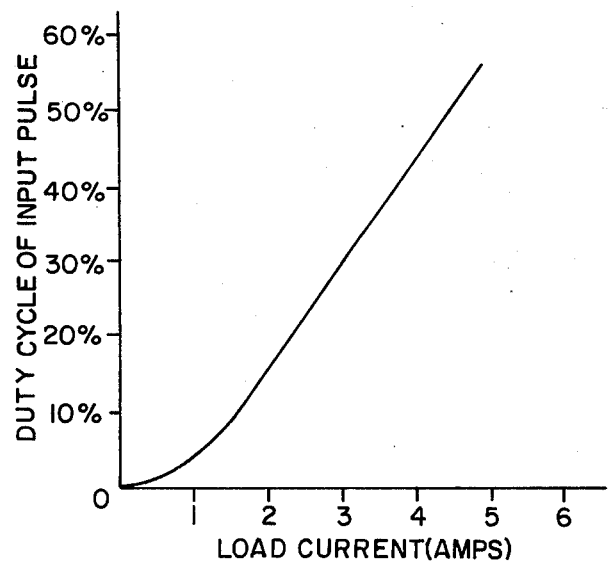
FIG. 4 is a curve illustrating the RF load current as a function of the duty cycle of the input pulse.

FIG. 4 is a diagram illustrating the current measured in the load 38 of the circuit illustrated in FIG. 2 as a function of the duty cycle of the input signal. It should be noted that the magnitude of the load current is essentially linear with respect to the duty cycle of the input signal over a range of 5% to 50%. This gives the circuit illustrated a very linear AM modulation characteristic within this range. The non-linearity between a zero duty cycle and 5% can be substantially improved by utilizing negative feedback between the AM modulated output signal of the amplifier and the modulator which produces the duty cycle modulated input signal. This type of negative feedback to reduce distortion is a well known and accepted technique and therefore will not be discussed in detail.

From the foregoing discussion it is obvious that a single ended class D amplifier having high efficiency and a very linear AM modulation characteristics has been disclosed. This circuit is particularly useful when it is desirable to generate high power levels utilizing solid state switching devices because the power dissipation levels of these elements is relatively low. Operating these elements as class D amplifiers permits the generation of maximum power levels with minimum dissipation in the switching devices. Frequency modulation can also be utilized by frequency modulating the input signal.

We claim:

1. A class D amplifier circuit for amplifying an RF input signal, comprising in combination:
    a. an on-off switching circuit responsive to said RF input such that said switching circuit alternatively switches to produce high and low conductivity states between two terminals of said switching circuit;
    b. a harmonic circuit; and
    c. an RF circuit, wherein:

d. said switching circuit, harmonic circuit and RF circuit are series coupled to the positive and negative terminals of a DC power supply to form a Class D amplifier for producing an output signal having a frequency equal to the fundamental frequency of said input signal and an amplitude substantially proportional to the duty cycle of said input signal, said harmonic circuit storing energy when said switching circuit is in the high conductivity state and returning said stored energy to said power supply during the low conductivity state of said switching circuit.

2. A class D amplifier circuit in accordance with claim 1 wherein said harmonic circuit includes a transformer with said energy being stored in the form of a magnetic field.

3. A single ended class D amplifier in accordance with claim 2 wherein the secondary winding of said transformer and a diode are series coupled between the positive and negative terminals of said power supply.

* * * * *